United States Patent [19]

Jones

[11] Patent Number: 5,581,740

[45] Date of Patent: Dec. 3, 1996

[54] SYSTEM FOR READING CD ROM DATA FROM HARD DISKS

[75] Inventor: Craig S. Jones, Austin, Tex.

[73] Assignee: Dell USA, L.P., Austin, Tex.

[21] Appl. No.: 317,510

[22] Filed: Oct. 4, 1994

[51] Int. Cl.⁶ .................................................. G06F 13/00
[52] U.S. Cl. .......................... 395/500; 395/439; 395/441; 395/481; 395/492; 395/856; 364/246; 364/255.8; 364/966.6; 364/DIG. 1
[58] Field of Search .................................... 395/500, 439, 395/441, 481, 492, 856

[56] References Cited

U.S. PATENT DOCUMENTS

| | | | |
|---|---|---|---|
| 4,642,759 | 2/1987 | Foster | 395/500 |
| 4,727,512 | 2/1988 | Birkner et al. | 395/500 |
| 5,247,575 | 9/1993 | Sprague et al. | 380/9 |
| 5,297,258 | 3/1994 | Hale et al. | 395/441 |
| 5,313,612 | 5/1994 | Satoh et al. | 395/441 |
| 5,313,617 | 5/1994 | Nakano et al. | 395/500 |
| 5,390,187 | 2/1995 | Stallmo | 395/441 |
| 5,402,428 | 3/1995 | Kakuta et al. | 395/441 |
| 5,454,098 | 9/1995 | Pisello et al. | 395/500 |

*Primary Examiner*—Frank J. Asta
*Attorney, Agent, or Firm*—Henry N. Garrana; Mark P. Kahler; Michelle M. Turner

[57] ABSTRACT

A CD ROM server comprises a CD ROM drive and an array of hard disk drives. Means are provided for copying data from the CD ROM drive to the array of hard disk drives, and for deleting data from the array of hard disk drives, upon receipt of copy and delete requests, respectively, from a host computer system. Means are provided for the host computer to read data from the array of hard disk drives in the CD ROM format that the data had been stored in on the CD ROM. Means are also available to implement RAID technology with the array of hard disk drives for data reconstruction, striping, and redundancy. Means may be provided for the host computer to communicate directly with any SCSI devices connected to the server.

16 Claims, 1 Drawing Sheet

SYSTEM FOR READING CD ROM DATA FROM HARD DISKS

TECHNICAL FIELD

The invention relates generally to CD ROM servers and, more particularly, to a system for storing and reading CD ROM data on hard disk drives emulating CD ROM drives.

BACKGROUND OF THE INVENTION

A compact-disk read-only memory (CD ROM) is a non-magnetic disk, typically 4.72 inches (12 centimeters) in diameter, which can store as much as 680 megabytes of data. The data can be permanently recorded onto the CD ROM by using a laser beam to burn microscopic pits into the surface. Data can be read by using a low power laser to sense the presence or absence of pits.

A CD ROM (file) server is a mass storage device that holds programs and data that can be accessed and shared by workstations connected to a local-area network. CD ROM servers typically have multiple small computer system interface (SCSI) host bus adapters and a large, external chassis which houses multiple SCSI CD ROM drives.

The CD ROM format for the distribution of large quantities of data is well known, and dedicated computer file servers having multiple CD ROM drives for online CD ROM access have become popular. Such dedicated CD ROM server subsystems, which include 40 or more CD ROM drives, have become available for this purpose.

Although CD ROM servers are capable of storing and providing access to large quantities of data, CD ROM servers have many disadvantages. For example, compared to hard disks, access times for CD ROMs are approximately 50 times longer, and data transfer times are approximately 20–30 times longer. More significantly, CD ROM drives are relatively unreliable, having, for a given period of time, approximately 10 times as many failures as any other component of the server. Furthermore, CD ROM servers consume more power and are larger and more expensive than hard disk drives.

One solution is to copy CD ROM data to a conventional file server hard disk drive array. However, when that is done, the data is no longer in a CD ROM format, but rather is formatted for a file server. Moreover, the file server format may be incompatible with the CD ROM format so that CD ROM server software, which is designed to access data from CD ROMs, may not be able to access the same data in a conventional file server format. Furthermore, such a copying operation is a manual step and the data copied to the file system must be provided as a resource on the network. These steps increase the maintenance requirements of the server and increases the likelihood for human error.

Therefore, what is needed is a CD ROM-compatible server with improved reliability and performance, and with substantially reduced power consumption, cost, and size as compared to traditional CD ROM servers.

SUMMARY OF THE INVENTION

The foregoing problems are solved and a technical advance is achieved by a CD ROM server architecture which performs the traditional functions of a CD ROM server in addition to having improved reliability and performance and substantially reduced size and power consumption. In a departure from the art, a CD ROM server is provided with an intelligent storage subsystem controller, one or more hard disk drives which are dedicated to storing CD ROM images, one or more CD ROM drives, and software to manage the storage subsystem configuration.

In a preferred embodiment, the CD ROM server comprises an intelligent storage controller, an array of multiple hard disk drives, and a CD ROM drive. Means are provided to copy, upon receipt of a copy request from the host computer, data from a CD ROM in the CD ROM drive to a location in the array of hard disk drives. Means are also provided for the host computer to read, in CD ROM format, CD ROM data stored on the array of hard disk drives. Means are further provided to delete, upon receipt of a delete request from the host computer, CD ROM data previously copied onto the array of hard disk drives.

The array of hard disk drives may be implemented using redundant array of inexpensive disks (RAID) technology for data reconstruction, striping, and redundancy. Means may also be provided for the host computer to communicate directly with any SCSI devices connected to the controller.

The present invention results in several technical advantages. For example, the performance of a CD ROM driver is enhanced by a factor of at least ten. Not only are access speeds and data transfer rates enhanced, but SCSI buses are more efficiently utilized by hard disk drives than by CD ROM drives.

A further technical advantage achieved with the present invention is that reliability is greatly enhanced, resulting in a mean time between failures that is 30 to 40 times greater than that of a conventional CD ROM driver.

A further technical advantage achieved with the present invention is that it is compatible with CD ROM server software.

A further technical advantage achieved with the present invention is that a CD ROM image may be stored onto hard disks by initiating a single copy command; deletion of CD ROM images is just as simple.

A further technical advantage achieved with the present invention is that less power is consumed and less cooling is required than with conventional CD ROM drivers.

A further technical advantage achieved with the present invention is that data may be compressed by the intelligent storage controller, enabling unused or partially used sectors of the CD ROM to be stored in less space on a dedicated hard disk than on the CD ROM, thus making the hard disk drive subsystem more cost effective.

A further technical advantage achieved with the present invention is that, because hard disk drives are much more compact than comparable CD ROM drives, the present invention would, similarly, have a much smaller physical size than CD ROM drives.

DESCRIPTION OF THE PREFERRED EMBODIMENTS

Figure 1:
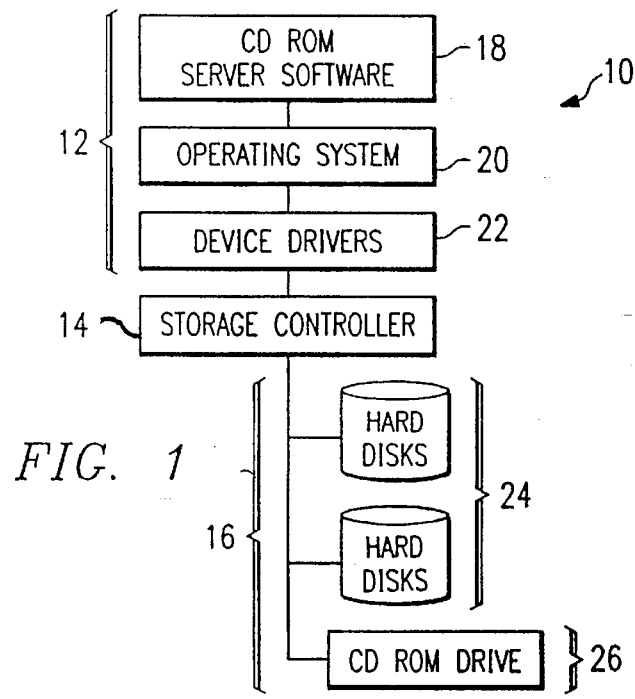
FIG. 1 is a functional block diagram of a CD ROM server embodying features of the present invention.

In FIG. 1, the reference numeral 10 designates a preferred embodiment of a CD ROM server. The server 10 includes a host computer 12, an input/output intelligent storage controller 14, and storage media 16. The host 12 includes CD ROM server software 18, an operating system 20, and host device drivers 22. The storage media 16 include an array of disk drives 24 and a CD ROM drive 26. Although not shown, it should be understood that tape drives could also be included as part of the storage media 16. Where not shown, it is understood that the components of the server 10 are interconnected by a conventional internal bus.

Figure 2:
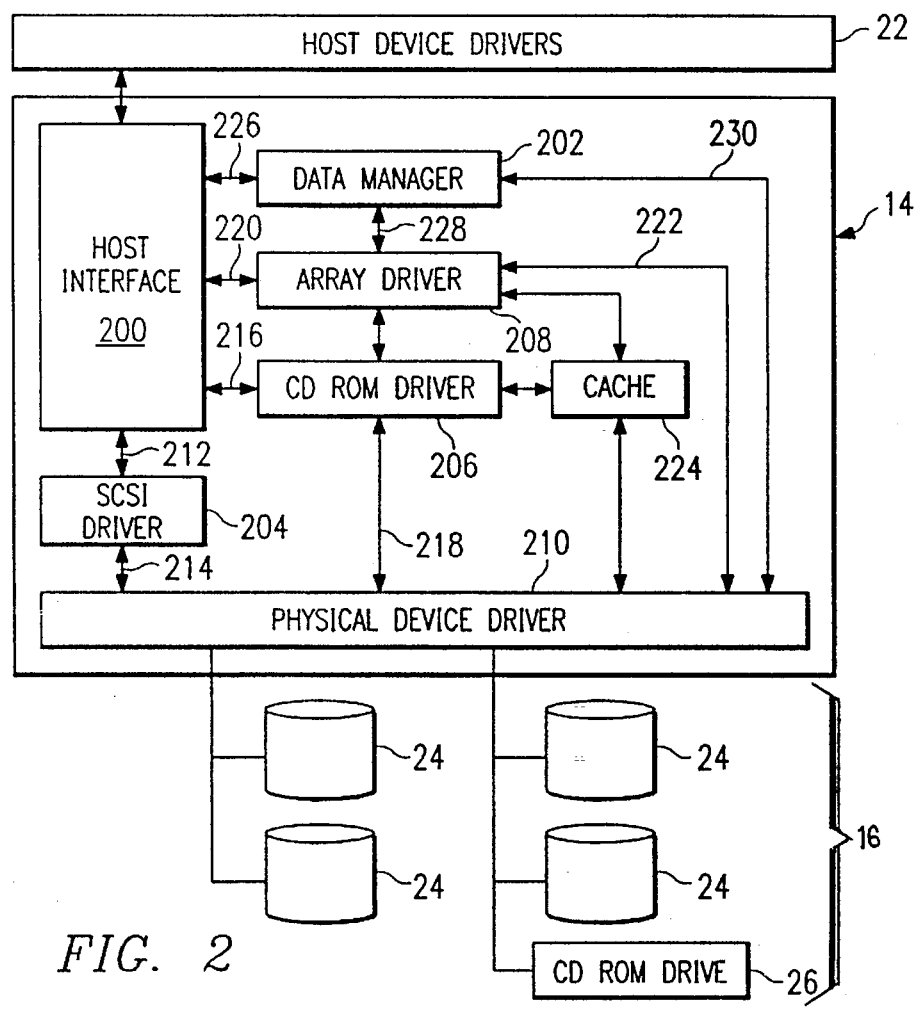
FIG. 2 is a functional block diagram of an intelligent storage controller portion of the CD ROM server of FIG. 1.

Referring to FIG. 2, the storage controller 14 includes two I/O request initiators: a host interface 200 and a data manager 202. I/O operations are performed by a SCSI driver 204, a CD ROM driver 206, an array driver 208, and a physical device driver 210. The physical device driver 210 is substantially identical to the host device driver 22 and is responsible for I/O to the storage media 16. While not shown, it should be understood that the controller 14 includes storage management software for the controller 14.

The host interface 200, typical of an interface to a SCSI adapter, manages communications with the host computer 12 (FIG. 1). The computer 12 issues data I/O, or read and write, requests to the interface 200 via the host device drivers 22. The host interface 200 then routes the I/O requests to the physical device driver 210 via one of the three I/O drivers, which are the SCSI driver 204, the CD ROM driver 206, or the array driver 208 via interfaces 212 and 214, 216 and 218, or 220 and 222 respectively. The selection of the driver to which requests are routed is determined with reference to a lookup table (not shown) stored in the interface 200, it being understood that write requests will not be routed to the CD ROM driver 206.

The SCSI driver 204 is a passthrough driver which provides a direct connection between the host interface 200, via the interface 212, and the physical device driver 210, via the interface 214, so that SCSI devices may be attached to the controller 14 and accessed directly by the host computer 12. If the host 12 is, for example, executing diagnostic software, it could test a hard disk drive, CD ROM drive, tape drive, or any generic device connected to the physical device driver 210 by effectively issuing I/O requests directly to the desired device. It can be appreciated that the SCSI driver therefore performs no emulation, translation, or distribution on multiple data storage devices.

The array driver 208 has a layered architecture which provides the characteristics of a SCSI disk drive while performing RAID striping and redundancy features on the array 24, which array may be any disk which is mirrored, data-guarded, or data-striped, or any RAID arrangement with multiple disks emulating the function of a single disk. The array driver 208 issues I/O requests to the physical device driver 210 which actually performs the disk I/O operations.

The CD ROM driver 206 converts a CD ROM I/O request to a disk I/O request using a data structure which maps CD ROM data onto a region of one or more of the hard disk drives 24. The CD ROM driver 206 then passes the request to either (1) the physical device driver 210, or (2) the array driver 208. It can be appreciated, therefore, that the CD ROM driver emulates the semantics of a CD ROM device, thereby supplying the code required to enable the disk drives 24 to operate like a CD ROM and respond to CD ROM requests. The CD ROM driver 206 may also interface with a cache 224, using standard disk software caching techniques, and direct memory access (DMA) controllers (not shown).

The data manager 202 is operatively connected to be responsive to copy and delete requests issued from the host interface 200 via an interface 226, as will be described, and to initiate I/O requests on either the array driver 208 via an interface 228, or the physical device driver 210 via an interface 230. The data manager 202 generally runs in the background, that is, while the host computer 12 is executing other programs, or, while the host interface 200 is initiating other I/O requests, and can, upon receiving a copy request from the host interface, manage the operation of copying data from a CD ROM in the CD ROM drive 26 to the hard disk drive array 24. During such copying operations, the data manager 202 modifies the configuration of the storage controller 14 by updating nonvolatile RAM or control information in reserved areas of the disk drive array 24 via the physical disk driver 210. It is necessary to modify the configuration so that information may be stored that describes a new CD ROM title; then, after the copying operation is completed, or the next time that the computer is booted up, the emulated CD ROM title appears to the host 12 to be in an actual physical CD ROM drive. Similarly, upon receiving a request from the host interface 200 to delete a CD ROM title from the hard disk drive array 24, the data manager 202 issues a request to either the driver 208 or the driver 210 to delete the indicated image and to perform any "garbage collection" necessary to recover the newly freed space on the hard disk drive array 24.

The data manager 202 can also operate in the background independently of the host interface 200 to perform data reconstruction procedures that are required to implement RAID redundancy techniques, such as hot-sparing, hot-plugging, initiating background data reconstruction, and managing event logs.

In operation, a CD ROM would be inserted into the CD ROM drive 26. Then a command to copy an image of the CD ROM to the hard disk drive array 24, would be made through an input device, such as a keyboard (not shown) connected directly, or indirectly through the host computer 12, to the controller 14. The data manager 202 would then allocate some space for the CD ROM image on the array of hard disk drives 24. The data manager 202 then issues a read request to the CD ROM driver 206. The read request then initiates the transfer of data from the CD ROM drive 26 via the physical device driver 210 to the cache 224. A write request initiates the transfer of data from the cache 224 through the physical device driver 210 to the hard disk drives 24. A series of such read and write request sequences are performed until the contents of the CD ROM are copied to the hard disk drive array 24. Control data structures are then updated to indicate that the copy is complete and that the emulated CD ROM device exists on the hard disk drive and will appear to the host as a CD ROM drive. The host 12 may then issue read requests to the CD ROM device. The host interface 200 would then route the request to the CD ROM driver 206 which in turn would convert the actual data portion of that I/O into a hard disk read request that is submitted to the array driver 208. The array driver 208 would then decompose the request and pass it to the hard disk drive array 24. The requested data is then read from the hard disk drive array 24 and input to the cache 224. The data is then passed from the cache 224 to the CD ROM driver 206, which converts the data to a CD ROM format and passes it via the interface 216 to the host interface 200. The read process as described may be repeated indefinitely.

A CD ROM title may be deleted by entering, through the input device to the host computer 12, a command to delete the title, causing thereby the host interface 200 to issue a delete request to the data manager 202. The delete request is then registered with the data manager 202 which then deletes the title from its address space, frees all the data that is occupied on the hard disk drive 24, and then launches a "garbage collection" or "compaction"0 operation that allows the remaining space to be more efficiently used.

The embodiment of the present invention as described herein has many advantages over the prior art, including, for example, a performance enhancement of a order of magnitude over a conventional CD ROM driver. Not only are access speeds and data transfer rates enhanced, but SCSI buses are more efficiently utilized by hard disks than by CD ROMs. Reliability is also greatly enhanced, resulting in a mean time between failures that is 30 to 40 times greater than that of a conventional CD ROM driver.

Further technical advantages achieved with the present invention include low power consumption and low heat generation as compared with conventional CD ROM drivers. Data compression schemes may be implemented by the intelligent storage controller enabling unused or partially used sectors of the CD ROM to be stored in less space on a dedicated hard disk than on the CD ROM, thus making a hard disk drive subsystem more cost effective. The present invention would also require much less physical space than CD ROM drives, since hard disk drives are much more compact than CD ROM drives.

An alternative method of storing CD ROMs, which requires manually storing the CD ROM image onto hard disks in a file server format, compromises compatibility with CD ROM server software. A technical advantage with the present invention is that a CD ROM may be copied onto hard disks without compromising compatibility. Furthermore, such copying may be initiated by a single copy command. Deletion of CD ROMs from hard disk drives with the present invention is just as simple as copying.

It is understood that the present invention can take many forms and embodiments. The embodiments shown herein are intended to illustrate rather than to limit the invention, it being appreciated that variations may be made without departing from the spirit or the scope of the invention. For example, the present invention may be implemented without RAID technology, in which case the array driver and SCSI driver may be eliminated from the controller 14. Though performance and reliability would be compromised somewhat, performance and reliability would still be much better than with conventional CD ROM drivers.

In another embodiment, the SCSI driver alone may be eliminated from the controller, in which case the array driver would provide SCSI semantics as well as RAID striping and redundancy features. Since no SCSI passthrough driver exists, neither the attached CD ROM drive nor the attached disk drives are directly accessible by the host. The CD ROM driver may pass I/O requests directly to the physical disk drive, or in an improved implementation of the embodiment, the CD ROM driver may pass I/O request to the array driver.

In a still further embodiment, an application program could be provided for execution on the host computer 12, the device drivers 22 being responsive to the program. The program may include pop-up terminate-and-stay-resident (TSR) windows written for a Disk Operating System (DOS), or pop-up windows written for such user interfaces as the Windows or Macintosh graphical user interfaces. A window may list the CD ROM title in the dedicated CD ROM drive 26 and the emulated CD ROM titles in the hard disk drive array 24, and prompt for commands to perform such functions as copying a CD ROM title to the hard disk drive array 24 or deleting a CD ROM title from the hard disk drive array 24.

In a still further embodiment, rather than entering commands to the controller 14 through an input device (such as a keyboard) connected to the host computer 12, commands could be entered directly into the host interface 200 through a simple dedicated input console, comprising, for example, a couple of buttons on a keypad and a line or LED display, the console being connected to the controller 14.

Although illustrative embodiments of the invention have been shown and described, a wide range of modification, change, and substitution is intended in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. A compact-disk read-only memory (CD ROM) server connectable to a computer system having a host interface, said server comprising:

at least one hard disk;

at least one CD ROM drive;

means for copying data from a CD ROM in said at least one CD ROM drive to said at least one hard disk, said copying means being responsive to receipt of a request to copy issued to said server from said computer system; and means for converting a CD ROM I/O request to a hard disk I/O request and providing said converted hard disk I/O request to said at least one hard disk for enabling said at least one hard disk to emulate a CD ROM drive.

2. The server of claim 1 further comprising means for said computer system to read, in CD ROM format, said data from said at least one hard disk.

3. The server of claim 1 further comprising means for deleting said data from said at least one hard disk responsive to receipt of a request to delete issued to said server from said computer system.

4. The server of claim 1 wherein said at least one hard disk includes an array of hard disks, and said server further comprises means for implementing redundant array of inexpensive disks (RAID) technology on said array of hard disks for data reconstruction, striping, and redundancy.

5. The server of claim 1 further comprising an input device directly connected to said host interface so that commands may be entered directly to said host interface, thereby bypassing said computer system.

6. The server of claim 5 further comprising:

at least one physical device driver electrically connected to said CD ROM drive; and said copying means comprising a data manager electrically connected between said host interface and said physical device driver, so that, upon receipt of a copy request from said host interface, data from a CD ROM inserted in said at least one CD ROM drive is copied to at least one hard disk.

7. The server of claim 6 wherein said host interface is also electrically connected to receive requests from said host computer system to delete specified CD ROM data from said at least one hard disk, and to pass said delete request to said data manager which then deletes specified CD ROM data from said at least one hard disk.

8. The server of claim 6, wherein said at least one hard disk includes an array of hard disks, and said server further comprises means to implement redundant array of inexpensive disks (RAID) technology on said array of hard disks for data reconstruction, striping, and redundancy.

9. The server of claim 8, further comprising an array driver connected to said interface, to said physical device driver, and to said data manager, said array driver providing small computer system interface (SCSI) disk semantics and performing RAID striping and redundancy features.

10. The server of claim 8, wherein said array driver is also connected to said CD ROM driver so that said CD ROM may direct said I/O requests to said array driver.

11. A compact-disk read-only memory (CD ROM) server connectable to a host computer system, said server comprising:

a host interface electrically connected to receive I/O requests from said host computer system;

a CD ROM driver electrically connected to said host interface for receiving I/O requests from said host interface;

a physical device driver electrically connected to said CD ROM driver;

at least one hard disk electrically connected to said physical device driver and having data stored thereon, said CD ROM driver converting said I/O requests from said CD ROM format to a format readable by said at least one hard disk for enabling said at least one hard disk to emulate a CD ROM drive, said CD ROM driver directing said converted I/O requests to said physical device driver for servicing.

12. The server of claim 11, further comprising an input device directly connected to said host interface so that commands may be entered directly to said host interface, bypassing said host computer.

13. The server of claim 11, further comprising a small computer system interface (SCSI) passthrough driver for facilitating direct access by said host computer system to SCSI devices attached to said physical device driver.

14. A method of reading a compact-disk read-only memory (CD ROM) in a CD ROM drive connectable to a host computer system via a server, the method comprising:

copying data from said CD ROM onto at least one hard disk upon receipt of a copy request;

said host computer generating a read request to said server in said CD ROM format;

converting said read request into a disk format to enable said at least one hard disk to emulate a CD ROM drive;

reading the data from said at least one hard disk in response to said converted read request.

15. The method of claim 14, wherein said at least one hard disk includes an array of hard disks, and the method further comprises reconstructing data and storing redundant data in stripes on said array of hard disks using redundant array of inexpensive disks (RAID) technology.

16. The method of claim 14, further comprising deleting said data from said hard disk responsive to receipt of a delete request issued from a computer system.

* * * * *